(12) United States Patent
Vicard et al.

(10) Patent No.: US 9,093,289 B2
(45) Date of Patent: Jul. 28, 2015

(54) METHOD FOR ASSEMBLING AT LEAST ONE CHIP USING A FABRIC, AND FABRIC INCLUDING A CHIP DEVICE

(75) Inventors: Dominique Vicard, Bernin (FR); Jean Brun, Champagnier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 268 days.

(21) Appl. No.: 13/521,589

(22) PCT Filed: Feb. 2, 2011

(86) PCT No.: PCT/FR2011/000065
§ 371 (c)(1),
(2), (4) Date: Jul. 11, 2012

(87) PCT Pub. No.: WO2011/095708
PCT Pub. Date: Aug. 11, 2011

(65) Prior Publication Data
US 2013/0033879 A1 Feb. 7, 2013

(30) Foreign Application Priority Data
Feb. 3, 2010 (FR) ..................... 10 00426

(51) Int. Cl.
| | |
|---|---|
| *H05K 7/06* | (2006.01) |
| *F21V 21/00* | (2006.01) |
| *H05K 13/00* | (2006.01) |
| *H01L 29/06* | (2006.01) |
| *D03D 1/00* | (2006.01) |
| *D03D 9/00* | (2006.01) |
| *D03D 15/00* | (2006.01) |
| *H01L 23/00* | (2006.01) |
| *H01L 25/065* | (2006.01) |
| *H01L 25/00* | (2006.01) |

(52) U.S. Cl.
CPC .......... *H01L 29/0657* (2013.01); *D03D 1/0088* (2013.01); *D03D 9/00* (2013.01); *D03D 15/00* (2013.01); *H01L 24/49* (2013.01); *H01L 24/72* (2013.01); *D10B 2401/16* (2013.01); *D10B 2401/18* (2013.01); *D10B 2501/00* (2013.01); *H01L 25/0655* (2013.01); *H01L 25/50* (2013.01); *H01L 2224/4807* (2013.01); *H01L 2224/49* (2013.01); *H01L 2224/858* (2013.01); *H01L 2924/01014* (2013.01); *H01L 2924/01029* (2013.01); *H01L 2924/01058* (2013.01); *H01L 2924/01079* (2013.01); *H01L 2924/12041* (2013.01); *Y10T 29/49002* (2015.01)

(58) Field of Classification Search
CPC ......... D03D 15/00; D03D 13/00; D03D 1/00; D03D 15/0083; D03D 15/0011; D03D 1/0088; D03D 47/02; D03D 47/263; D03D 47/38; D03D 15/0061; D03D 15/08; D03D 25/00; D10B 2101/20; D10B 201/04; D10B 2401/18; B32B 2250/20; B32B 2262/0276; B32B 2262/101; B32B 27/12; B32B 5/024; B32B 5/12; D03C 19/005; A61F 13/0051; B23K 26/4085; B60R 2021/23509; D05B 27/06; D06N 3/0036; D06N 7/00; H05B 3/347; D04B 21/18; D04B 1/12; D04B 1/18; D04B 21/08; D04B 21/16; H05K 1/0366; H05K 2201/029; H05K 1/038; H05K 1/0393; H05K 9/009; B01D 2239/1233; H01H 13/785; H01H 2203/0085; H01H 2203/01; H01H 2229/00
USPC .......... 139/383 R, 420 R; 442/181, 203, 304, 442/366, 60, 10, 110, 184, 192, 217; 428/365; 28/140, 100; 174/54; 361/807
See application file for complete search history.

(56) References Cited

U.S. PATENT DOCUMENTS

| | | | | |
|---|---|---|---|---|
| 4,034,552 | A * | 7/1977 | Davidson .................... | 368/280 |
| 5,838,642 | A * | 11/1998 | Tully ........................... | 368/282 |
| 6,213,634 | B1 * | 4/2001 | Harrington et al. ......... | 368/283 |
| 7,793,361 | B2 * | 9/2010 | Ishihara et al. ................ | 2/170 |
| 8,677,515 | B2 * | 3/2014 | Ishihara et al. ................ | 2/170 |
| 2005/0029680 | A1 * | 2/2005 | Jung et al. .................. | 257/787 |

| | | | |
|---|---|---|---|
| 2005/0223552 A1 | 10/2005 | Meyer et al. | |
| 2006/0035554 A1* | 2/2006 | Glaser et al. | 442/301 |
| 2006/0258205 A1* | 11/2006 | Locher et al. | 439/517 |
| 2009/0200066 A1* | 8/2009 | Vicard et al. | 174/255 |
| 2009/0227069 A1* | 9/2009 | Brun et al. | 438/113 |
| 2011/0001237 A1* | 1/2011 | Brun et al. | 257/737 |
| 2011/0149540 A1* | 6/2011 | Brun et al. | 361/783 |
| 2011/0198735 A1* | 8/2011 | Brun et al. | 257/622 |
| 2012/0064671 A1* | 3/2012 | Brun et al. | 438/118 |
| 2012/0118427 A1* | 5/2012 | Brookstein et al. | 139/35 |
| 2013/0074331 A1* | 3/2013 | Brun | 29/832 |
| 2014/0027038 A1* | 1/2014 | Lee | 156/60 |

FOREIGN PATENT DOCUMENTS

| | | |
|---|---|---|
| DE | 10 2008 011 133 A1 | 9/2009 |
| WO | WO 2008/007237 A2 | 1/2008 |
| WO | WO 2008/025889 A1 | 3/2008 |
| WO | WO 2008/080245 A2 | 7/2008 |

OTHER PUBLICATIONS

Brun et al., "Packaging and wired interconnections for insertion of miniaturized chips in smart fabrics," Microelectronics and Packaging Conference, Piscataway, NJ, Jun. 15, 2009.

International Search Report issued in International Patent Application No. PCT/FR2011/000065 dated Oct. 5, 2011.

\* cited by examiner

*Primary Examiner* — Hoa C Nguyen

*Assistant Examiner* — Michael Matey

(74) *Attorney, Agent, or Firm* — Oliff PLC

(57) ABSTRACT

A method for assembling a device on two substantially parallel taut threads. The device includes an electronic chip and two substantially parallel grooves open on opposite sides of the device. The distance separating the grooves corresponds to the distance separating the threads. The device presents a penetrating shape along an axis perpendicular to the plane of the grooves, having a base at the level of the grooves and an apex of smaller size than the distance separating the threads. The method includes the steps consisting in placing the apex of the device between the two threads; in moving the device between the two threads resulting in the threads being separated from one another by the penetrating shape of the device; and in continuing movement of the device until the threads penetrate into the grooves reverting to their initial separation distance.

16 Claims, 4 Drawing Sheets

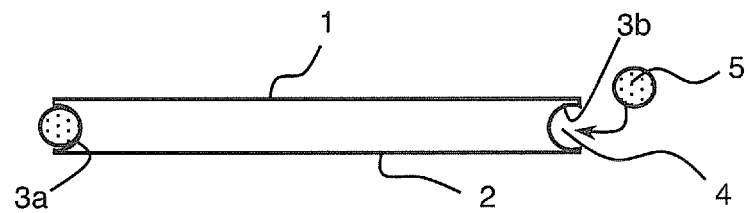
Figure 1 (Anterior Art)
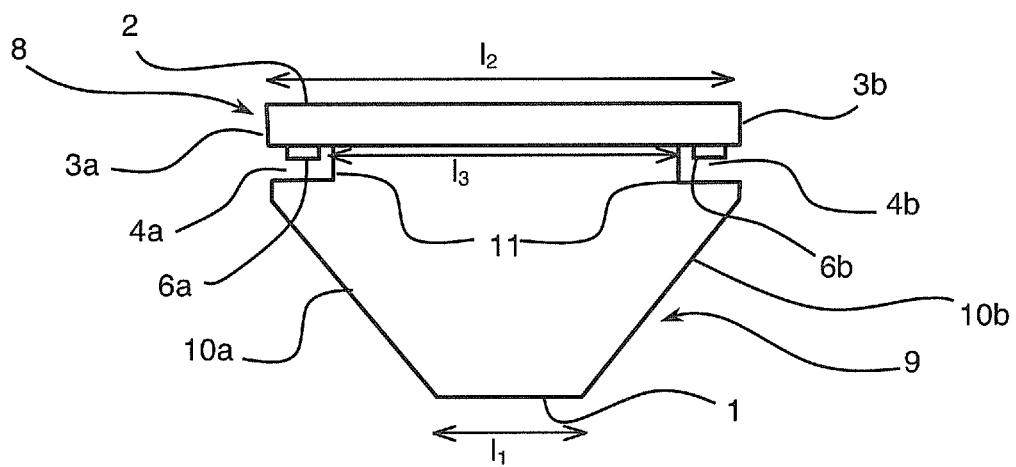
Figure 2
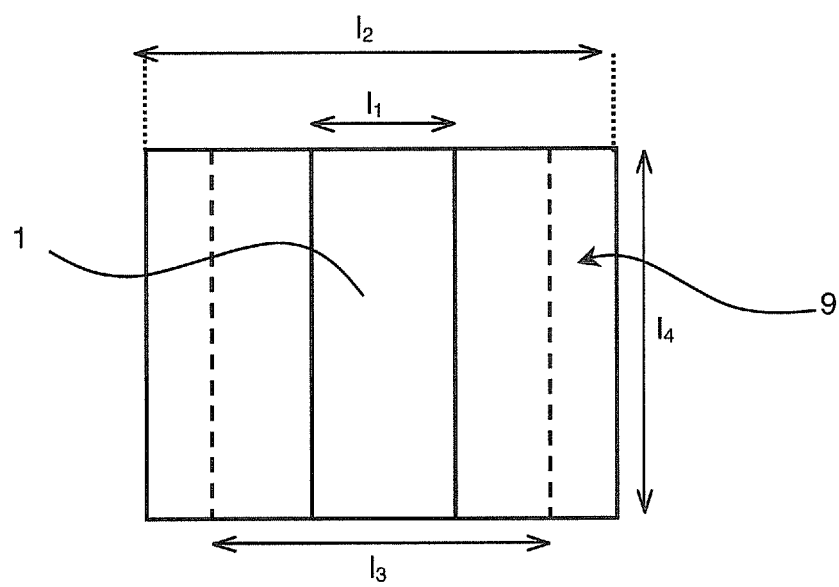
Figure 3

METHOD FOR ASSEMBLING AT LEAST ONE CHIP USING A FABRIC, AND FABRIC INCLUDING A CHIP DEVICE

BACKGROUND OF THE INVENTION

The invention relates to a device including an electronic chip and comprising two open grooves on opposite sides of the device.

STATE OF THE ART

Numerous techniques exist at the present time to connect microelectronic chips mechanically and electrically to one another. A conventional technique consists in making a rigid mechanical connection between the chips, once the chips have been formed on a substrate and released by dicing. The chips, then fixed on a rigid support, are then electrically connected before a protective coating is formed. This approach, consisting in making connection on a rigid support, is conventionally used when a great complexity exists in connection of the chips. It does however present the main drawback of using a rigid mechanical support, which is particularly unsuitable for integration in flexible structures.

The document WO2008/025889 filed by the applicant describes a microelectronic chip, as illustrated in FIG. 1, comprising two parallel main surfaces 1, 2 and lateral surfaces 3a, 3b connecting main surfaces 1, 2. Each of lateral surfaces 3a, 3b comprises a groove 4, provided with an electric connection element (not shown) and forming a housing for a thread element 5 having an axis parallel to the longitudinal axis of groove 4. The electric connection element is made by metallization of groove 4.

Thread element 5, the axis of which is parallel to the longitudinal axis of groove 4, can be secured to groove 4 by welding, by addition of material, by electrolysis, by bonding, or by embedding. These securing methods are complex to implement on account of the small size of the chip devices.

The pairs of threads thus provided with chip devices can then be woven with other threads to form a fabric. This requires certain precautions when handling during weaving in order to avoid tearing the chip devices off.

SUMMARY OF THE INVENTION

It is thus sought to incorporate electronic chip devices in a fabric in simple manner without precautions being required when performing weaving. For this, it is sought in particular to produce a chip device that can be incorporated in easy manner between two parallel taut threads, in particular belonging to a finished fabric.

This requirement is met by means of a chip device of particular configuration. The device comprises an electronic chip and two substantially parallel grooves open on opposite sides of the device. The distance between the grooves corresponds to the distance between the threads. The device presents a penetrating shape along an axis perpendicular to the plane of the grooves, having a base at the level of the grooves and an apex of smaller dimension than the distance between the threads.

The device is inserted between the two threads according to a method comprising the steps consisting in positioning the apex of the device between the two threads; in moving the device between the two threads resulting in the threads being separated from one another by the penetrating shape of the device; and in continuing movement of the device until the threads enter the grooves, reverting to their initial separation distance.

A fabric can thus be achieved comprising a device provided with an electronic chip and with two substantially parallel grooves open on opposite sides of the device in which two substantially parallel consecutive threads of the fabric are inserted, the device presenting a penetrating shape along an axis perpendicular to the plane of the grooves, having a base at the level of the grooves and an apex of smaller size than the distance separating the threads.

BRIEF DESCRIPTION OF THE DRAWINGS

Other advantages and features will become more clearly apparent from the following description of particular embodiments of the invention, given for example purposes only and represented in the appended drawings, in which:

FIG. 1 illustrates a chip according to the prior art.

FIG. 2 illustrates an embodiment of a chip device.

FIG. 3 illustrates a bottom view of the device of FIG. 2.

DESCRIPTION OF PARTICULAR EMBODIMENTS

Figure 4:
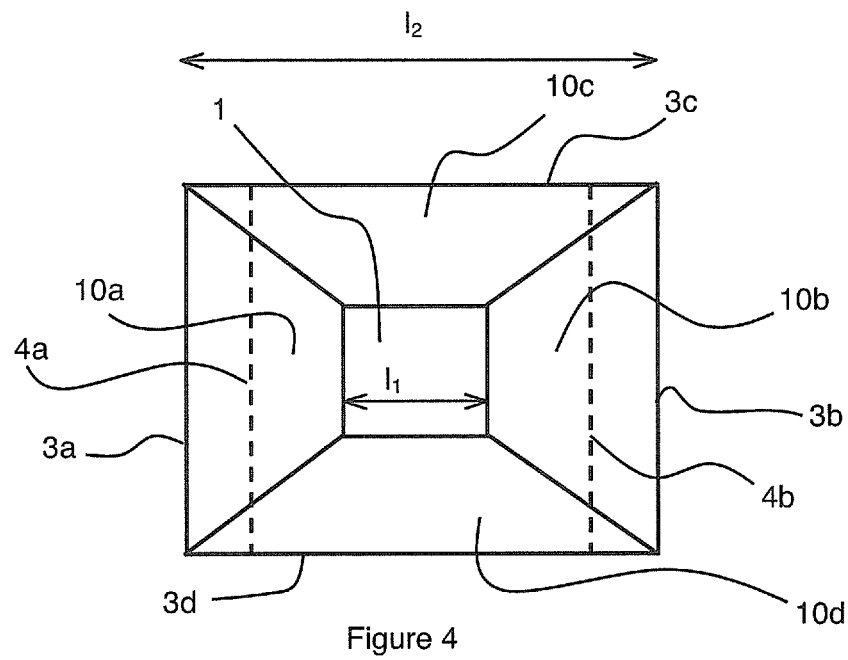
FIG. 4 illustrates a bottom view of another embodiment of a chip device.

As indicated in the foregoing, it is sought to produce an electronic chip device provided with grooves for insertion of threads that is easily incorporable in a fabric. These chip devices will in particular be able to be incorporated in a finished fabric. In other words, they will not have to be secured to threads that are subsequently used to weave the fabric.

As a general rule, a fabric is formed by warp threads that are substantially parallel to one another and by weft threads that are substantially parallel to one another and that cross the warp threads. Two consecutive warp threads and two consecutive weft threads form a stitch more often than not having the general shape of a parallelogram. Other types of fabrics and stitches can naturally be envisaged.

A chip device as described in greater detail in the following comprises a part presenting a penetrating profile, designed to be inserted in a stitch of the fabric and to separate the threads forming the stitch under a pressure exerted on the device, until these threads reach the height of the grooves and are inserted in the latter by elastic return. More specifically, the profile in question presents a penetrating characteristic along an axis perpendicular to the plane of the grooves. Its base is situated at the level of the grooves and its apex is of smaller size than the distance separating two consecutive threads of the fabric. What is meant by "plane of the grooves" is a plane passing as close as possible to the longitudinal axes of the grooves, in the case where the grooves are not strictly parallel.

FIG. 2 represents a front view of an embodiment of a chip device able to be incorporated in a fabric. Elements that are the same as in FIG. 1 are designated by the same reference numerals.

The device comprises an electronic chip 8 and two open grooves 4a, 4b on opposite sides of the device. In this embodiment, the grooves are hollowed out in two substantially parallel opposite surfaces 3a and 3b of the device, and their longitudinal axes are substantially parallel. The grooves 4a and 4b are pass-through, i.e. they open onto surfaces of the device perpendicular to surfaces 3a and 3b.

In most applications, chip 8 is designed to be electrically connected to other chips, to a data bus, an electric power supply, an antenna, etc. For this, grooves 4a and 4b are provided with conducting bumps 6a and 6b that will be connected to the threads inserted in the grooves, these threads then being conducting or comprising conducting fibers. Bumps 6a and 6b are preferably situated on a side wall of the grooves, for example on the same side the chip is located. Each bump can also form a mechanical grip enabling a thread to be fixed between the bump and the opposite side wall of the groove.

The device comprises a penetrating shape 9 with a penetrating profile which, in this embodiment, is of trapezoid cross-section. The base of the trapezium is connected to the edges of walls 3a and 3b, whereas the apex of the trapezium forms one of the main surfaces of the device, for example surface 1. The inclined edges of the trapezium are designated by 10a and 10b.

FIG. 3 represents a bottom view of the device of FIG. 2. As can be seen in this figure, the penetrating shape 9 is prismatic in this embodiment. The inclined surfaces of the prism will also be designated by 10a and 10b, like the inclined edges of the trapezium in FIG. 2.

This penetrating shape enables the device to be easily inserted in a finished or partially finished fabric, in particular between two consecutive taut warp or weft threads. The dimensions of the top surface 1 of the prism are preferably smaller than those of the stitch of the fabric. The device then simply has to be presented with its surface 1, which will henceforth be called "penetration surface", facing the two consecutive threads, with grooves 4a and 4b substantially parallel to the threads, and surface 1 then be made to penetrate between the two threads. In the course of penetration, the threads are separated by inclined walls 10a and 10b of the prism, until the threads reach the height of the grooves and are inserted therein by elastic return.

The device can be formed in two parts, i.e. a flat chip 8 on which a cover forming penetrating shape 9 is assembled. Grooves 4a and 4b are then preferably formed at the interface between the chip and cover. In this embodiment, penetrating shape 9 comprises two rims 11 the perpendicular surfaces of which respectively define a side wall of the grooves and the bottom of the grooves. The other side wall of the grooves is defined by chip 8.

In the embodiments described in the following, penetrating shape 9 of the chip device is achieved by the cover. The person skilled in the trade will naturally be able to pattern the chip instead of the cover to give it the required shape. It is also possible to produce the device from a monolithic part including a chip by suitably patterning the monolithic part.

The transverse dimension $I_1$ of penetration surface 1 is preferably smaller than the pitch of the threads of the fabric and the transverse dimension $I_2$ separating lateral surfaces 3a and 3b is larger than the pitch. Ideally, the pitch of the threads is substantially equal to the distance $I_3$ separating the bottoms of grooves 4a and 4b.

The length $I_4$ of prism 9, and therefore of penetration surface 1, is equal to the length of the device. As this length is defined by the size of the device, it is more difficult to adapt it to any stitch size of a fabric. The embodiment of FIGS. 2 and 3 is thus rather suitable for incorporation in a fabric the stitches of which are of elongate shape in the axis of prism 9.

FIG. 4 represents an embodiment of a chip device that is more suitable for insertion in stitches of any shape of a finished fabric, in bottom view. The front view, not shown, is similar to that of FIG. 2. Penetrating shape 9 has the shape of a pyramid the base of which delineates grooves 4a and 4b with chip 8. The pyramid will be generally truncated and its apex will thus form penetration surface 1. In other words, penetrating shape 9 comprises four oblique surfaces 10a, 10b, 10c, 10d. Oblique surfaces 10a and 10b connect opposite lateral surfaces 3a and 3b, comprising grooves 4a, 4b, to corresponding opposite sides of surface 1. Oblique surfaces 10c and 10d connect the remaining opposite lateral surfaces 3c and 3d of the device to corresponding opposite sides of surface 1.

The dimensions of penetration surface 1 can be chosen independently in order to match them with a minimum stitch size. This surface 1 can be square, with a side as small as the fabrication technology permits.

Figure 5:
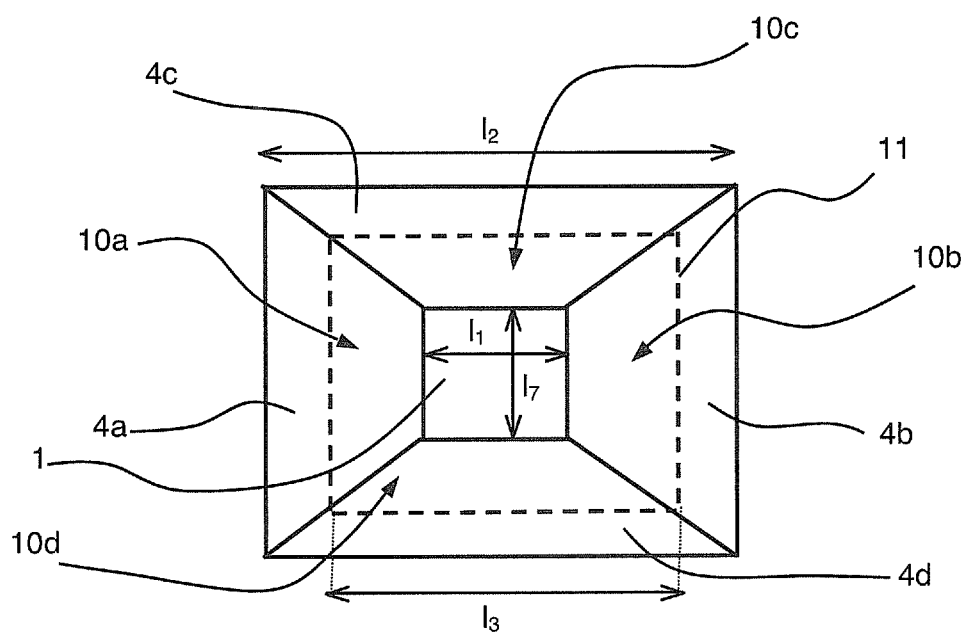
FIG. 5 illustrates a variant of the embodiment of FIG. 4 in bottom view.

FIG. 5 represents a variant of the embodiment of FIG. 4, in bottom view. Lateral surfaces 3c and 3d also comprise grooves 4c and 4d housing thread elements. These grooves 4c and 4d, like grooves 4a and 4b, are defined by rims 11 of penetrating shape 9 and a surface of chip 8, in this embodiment. The device thus comprises four grooves arranged as a rectangle, designed to receive the four threads of a fabric stitch.

Penetration surface 1 preferably has smaller transverse $I_1$ and longitudinal $I_7$ dimensions than the corresponding dimensions of a stitch of the fabric in which the device is to be inserted. Ideally, the dimensions separating the bottoms of grooves 4a and 4b on the one hand and the bottoms of grooves 4c and 4d on the other hand are substantially equal to the pitches of the threads in the corresponding directions (weft or warp).

Such a device is inserted in a fabric in the same manner as described in relation with FIGS. 2 and 3. It is presented with its penetration surface 1 facing the fabric and moved towards the fabric. Surface 1 penetrates into a stitch, and oblique walls 10a to 10d separate the four threads forming the stitch. When these four threads reach the height of grooves 4a to 4d, they penetrate into the latter by elastic return.

Such a device, once it has been inserted in a stitch of the fabric, will thus be secured by four threads inserted in the respective grooves 4a to 4d. This improves securing and moreover enables the number of possible electric interconnections to be increased.

Figure 6:
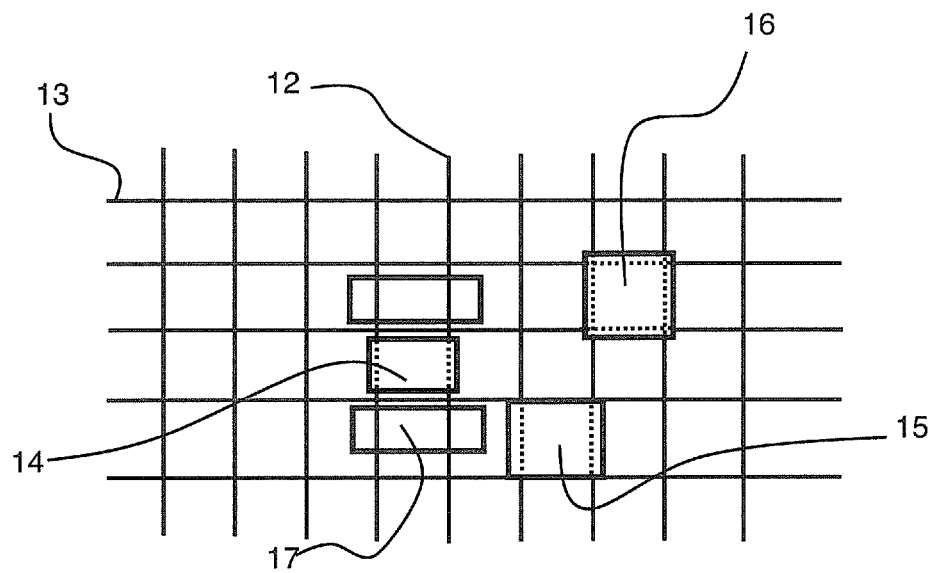
FIG. 6 illustrates a fabric in which chip devices are inserted, seen from above.

FIG. 6 schematically represents a fabric in which chip devices according to the different embodiments described in the foregoing have been incorporated. The fabric comprises weft threads 12 and warp threads 13. The weft threads and warp threads have been represented perpendicular and the warp and weft pitches have been represented substantially equal so that the stitches are square. The orientations of the threads and the pitches can naturally be of any nature without this affecting use of the chip devices described here—chip devices of suitable dimensions and shapes for the particular fabric in which they are to be incorporated will simply have to be provided.

Reference numeral 14 designates a chip device of the type of FIGS. 2 and 3, cooperating with two weft threads 12. As represented, the dimension ($I_4$ in FIG. 3) in the direction of the weft threads of this device is preferably smaller than the pitch of warp threads 13.

Reference numerals 15 and 16 respectively designate chip devices of the types of FIGS. 4 and 5.

In order not to deform the fabric by inserting a device of the type comprising two grooves (14 or 15) only, a blocking iron 17 can be added on each side of the location of the device, at the level of the surfaces devoid of grooves, so that the consecutive threads press on the latter. Iron 17 is located on the surface opposite the surface via which the device is inserted. It can come in the form of a bar the longitudinal axis of which is perpendicular to the longitudinal axis of the insertion grooves of the threads.

The pressure exerted when insertion of the device is performed therefore does not impair the fabric.

To prevent deformation of the fabric, it is also possible to pre-stick the latter so as to give it a sufficient rigidity.

In the case where it is desired to confirm insertion of the threads in the grooves, in particular when the threads, which are conducting, are to be pinched between a wall of the groove and a conducting bump 6a, 6b (FIG. 2), a clamping jaw (not shown) can be provided pressing on the edges of the device provided with grooves, after insertion by elastic return of the threads in the grooves. In this way, the jaw finishes inserting the threads in the grooves should the elastic force of the threads be insufficient. According to an alternative, the jaw, instead of pressing against the edges of the device, can be designed to tighten the threads exiting from each side of the device.

Figure 7:
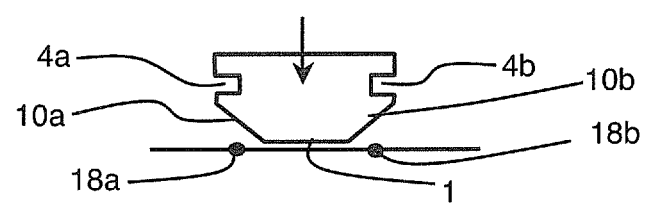
FIGS. 7 to 9 illustrate steps of insertion of a chip device in a fabric.
Figure 8:
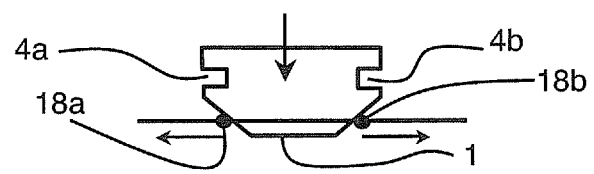
Figure 9:
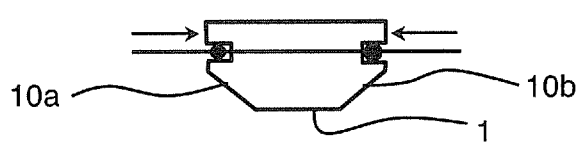

FIGS. 7, 8 and 9 illustrate three states in a method for insertion of a chip device in a fabric.

In FIG. 7, the device is first of all oriented with its penetration surface 1 facing the fabric, and then moved towards the fabric. If it is desired to place the device in a precise location of the fabric, for example between two specific consecutive threads 18a and 18b, or in a specific stitch, penetration surface 1 is centred with respect to the corresponding stitch, or with respect to the two corresponding threads 18a and 18b. In the opposite case, penetration surface 1 does not need to be centred with respect to a stitch—this surface 1, which is smaller than a stitch and connected to oblique surfaces, will procure self-centring on penetration into the fabric.

In FIG. 8, threads 18a and 18b are progressively separated by oblique surfaces 10a and 10b of the device as the device progressively penetrates into the fabric.

In FIG. 9, threads 18a and 18b have reached the height of grooves 4a and 4b. The threads revert to their initial position by elastic effect and are inserted in their respective grooves 4a and 4b.

Figure 10:
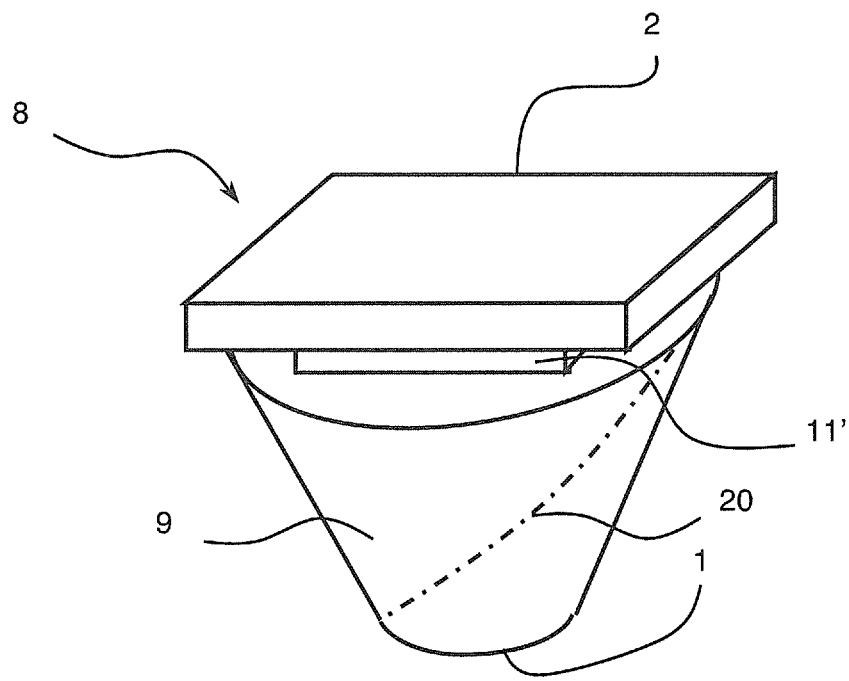
FIGS. 10 and 11 illustrate another embodiment of a chip device.
Figure 11:
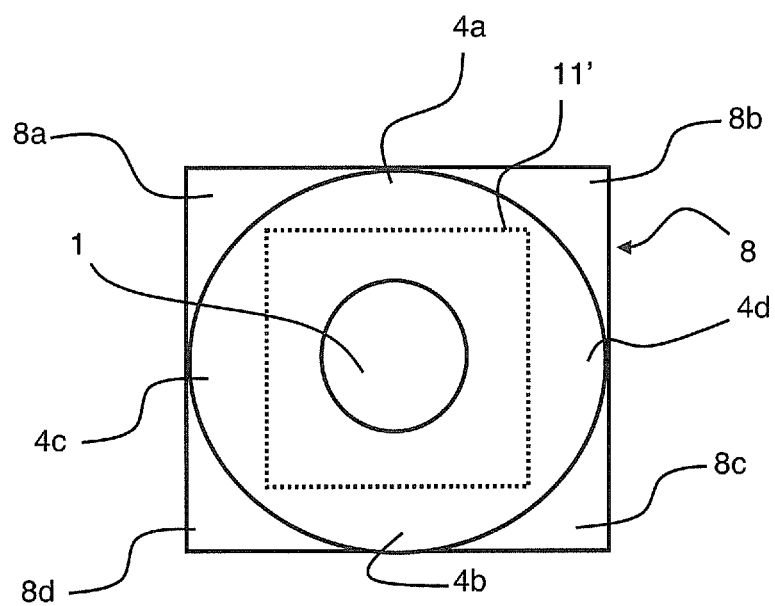

FIGS. 10 and 11 represent a perspective view and a bottom view of a third embodiment of a chip device. Penetrating shape 9 is formed by a cone the base of which, in conjunction with chip 8, delineates four peripheral grooves 4a to 4d. It is naturally possible to produce a device with two opposite grooves (4a and 4b) only. The bottoms of the grooves are defined by a rectangular pedestal 11', which is preferably square, extending from the base of penetrating shape 9 to chip 8. The cone is preferably truncated at its end, as illustrated in FIGS. 10 and 11, thereby delineating penetration surface 1. Chip 8 preferably has a square outline in which the base of the cone is inscribed. Four corners 8a, 8b, 8c and 8d of chip 8 are salient with respect to the base of the cone.

This device is inserted in a fabric in similar manner to the embodiments described in the foregoing. It further presents the particularity, if it is inserted rotated through 45°, i.e. with the diagonals of the chip parallel to the threads of the fabric, that corners 8a to 8d act as end-of-travel stops pressing against the threads delineating the stitch. An eighth of a turn is then applied to the device to align the grooves with the threads, enabling the threads to be inserted by elastic return in their respective grooves 4a to 4d.

According to an alternative embodiment of this device that is not represented, penetrating shape 9 in the form of a cone comprises a double thread screw 20 in the surface of the cone, each screw thread opening out into one of the two opposite grooves. This double thread screw then enables the device to be inserted by screwing between two consecutive threads. In this way, when assembly is performed, the screw threads of the double thread screw are placed in contact with two consecutive warp or weft threads, and rotation of the chip device on itself enables the latter to be screwed into the fabric until the threads are inserted in the grooves. This embodiment makes for easier assembly of chip devices in a very rigid fabric.

The chip device can comprise a light-emitting diode or provide any other type of function able to be performed by chip 8. Thus, by judiciously placing several devices in a fabric, it is possible to achieve precise patterns and to supply these devices via electrically conducting threads. It is also possible to insert devices of RFID type in a woven ribbon, the antennas of said devices then being achieved by electrically conducting threads of the fabric, for example made from copper.

Such devices can also be inserted in intelligent clothing in order to follow both the geographic movements of a person and his/her medical progression.

The dimensions of a side of the devices can be less than 5 mm, the thickness of chip 8 and of penetrating shape 9 being able to be less than 200 µm. The devices can then be inserted in a fabric using conventional machines for handling small objects. The insertion method in a fabric can then be set up at little cost.

Numerous variants and modifications of the embodiments described here will be apparent to the person skilled in the art. For example, it is possible to use an element of spacer type between penetrating shape 9 and chip 8 so as to keep the latter separated from one another and to define the bottoms of the grooves. Prismatic, pyramidal and conical penetrating shapes have been described, but any other convex shape can be suitable.

The invention claimed is:

1. A method for assembling a device on two threads, comprising the following steps:
   providing two substantially parallel taut threads;
   providing a device comprising an electronic chip and two substantially parallel grooves open on opposite sides of the device, a distance separating the grooves corresponding to a distance separating the threads, said device presenting a penetrating shape along an axis perpendicular to the plane of the grooves, having:
      a base at the level of the grooves, a length of the base being substantially equal to the distance separating the threads, and
      an apex having a length that is shorter than the distance separating the threads;
   placing said apex of the device between the two threads;
   moving the device between the two threads resulting in the threads being separated from one another by the penetrating shape of the device; and
   continuing movement of the device until said threads penetrate into the grooves reverting to their initial separation distance.

2. The method according to claim 1, wherein the penetrating shape of the device is conical and comprises a double thread screw with two screw threads each opening out into a respective groove, the method comprising the following steps:

placing the screw threads in contact with the two threads; and applying a screwing movement to the device.

3. The method according to claim 1, wherein a groove of the device comprises a bump for electric connection, the thread corresponding to the groove provided with the bump being electrically conducting.

4. The method according to claim 1, wherein the device comprises a cover defining the grooves, in conjunction with the electronic chip.

5. The method according to claim 4, wherein the cover has the shape of a pyramid.

6. The method according to claim 4, wherein the cover has the shape of a cone.

7. The method according to claim 1, wherein the threads are consecutive weft threads or consecutive warp threads.

8. A fabric including a device comprising an electronic chip and two substantially parallel grooves open on opposite sides of the device, in which two substantially parallel consecutive threads of the fabric are inserted, wherein the device presents a penetrating shape along an axis perpendicular to the plane of the grooves, having:
   a base at the level of the grooves, a length of the base being substantially equal to the distance separating the threads, and an apex having a length that is shorter than the distance separating the threads.

9. The fabric according to claim 8, wherein a groove of the device comprises a bump for electric connection, the thread inserted in the groove provided with the bump being electrically conducting and in electric contact with said bump.

10. The fabric according to claim 8, wherein the device comprises a cover delineating the grooves, in conjunction with the electronic chip.

11. The fabric according to claim 8, wherein in that the cover has the shape of a pyramid.

12. The fabric according to claim 8, wherein in that the cover has the shape of a cone.

13. The fabric according to claim 12, wherein the cone comprises a double thread screw with two screw threads, each screw thread opening out into one of the grooves.

14. The fabric according to claim 9, wherein the electronic chip comprises a light-emitting diode.

15. The fabric according to claim 8, wherein the device comprises four grooves arranged to form a rectangle, in which four threads are inserted forming a stitch of the fabric.

16. The fabric according to claim 8, wherein the threads are consecutive weft threads or consecutive warp threads.

\* \* \* \* \*